(12) United States Patent
Yonemitsu

(10) Patent No.: US 9,541,835 B2
(45) Date of Patent: Jan. 10, 2017

(54) GUIDE PATTERN DATA CORRECTING METHOD, PATTERN FORMING METHOD, AND COMPUTER READABLE RECORD MEDIUM

(71) Applicant: KABUSHIKI KAISHA TOSHIBA, Minato-Ku, Tokyo (JP)

(72) Inventor: Hiroki Yonemitsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 13/956,999

(22) Filed: Aug. 1, 2013

(65) Prior Publication Data
US 2014/0231388 A1    Aug. 21, 2014

(30) Foreign Application Priority Data

Feb. 18, 2013    (JP) .................................. 2013-29071

(51) Int. Cl.
*C03C 15/00*    (2006.01)
*G03F 7/40*    (2006.01)

(52) U.S. Cl.
CPC ...................... *G03F 7/40* (2013.01)

(58) Field of Classification Search
None
See application file for complete search history.

(56) References Cited

U.S. PATENT DOCUMENTS

| 7,749,687 | B2 | 7/2010 | Nakamura | |
|---|---|---|---|---|
| 2011/0209106 | A1* | 8/2011 | Cheng | G03F 1/38 716/55 |
| 2012/0058435 | A1 | 3/2012 | Seino et al. | |
| 2012/0127454 | A1* | 5/2012 | Nakamura | G03F 7/0002 355/77 |
| 2012/0214094 | A1 | 8/2012 | Mikoshiba et al. | |
| 2013/0075360 | A1* | 3/2013 | Nakamura | G03F 7/0002 216/41 |

FOREIGN PATENT DOCUMENTS

| JP | 2008-36491 | 2/2008 |
|---|---|---|
| JP | 2011-18778 | 1/2011 |

OTHER PUBLICATIONS

Notification of Reason for Rejection issued by the Japanese Patent Office on May 8, 2015, for Japanese Patent Application No. 2013-029071, and English-language translation thereof.
Notification of Reason for Rejection of Japanese Patent Application No. 2013-029071 dated Jan. 26, 2016, (5 pages including translation).
Notification of Reason for Rejection issued by the Japanese Patent Office on Oct. 2, 2015, for Japanese Patent Application No. 2013-029071, and English-language translation thereof.

* cited by examiner

*Primary Examiner* — Binh X Tran
*Assistant Examiner* — David Cathey, Jr.
(74) *Attorney, Agent, or Firm* — Finnegan, Henderson, Farabow, Garrett & Dunner LLP

(57) ABSTRACT

According to one embodiment, a guide pattern data correcting method is for correcting guide pattern data of a physical guide for formation of a polymer material to be microphase-separated. The physical guide has a plurality of concave portions in the guide pattern data, and at least two concave portions out of the plurality of concave portions are connected to each other. The guide pattern data is subjected to correction by shifting or rotation of at least either of the two connected concave portions.

3 Claims, 11 Drawing Sheets

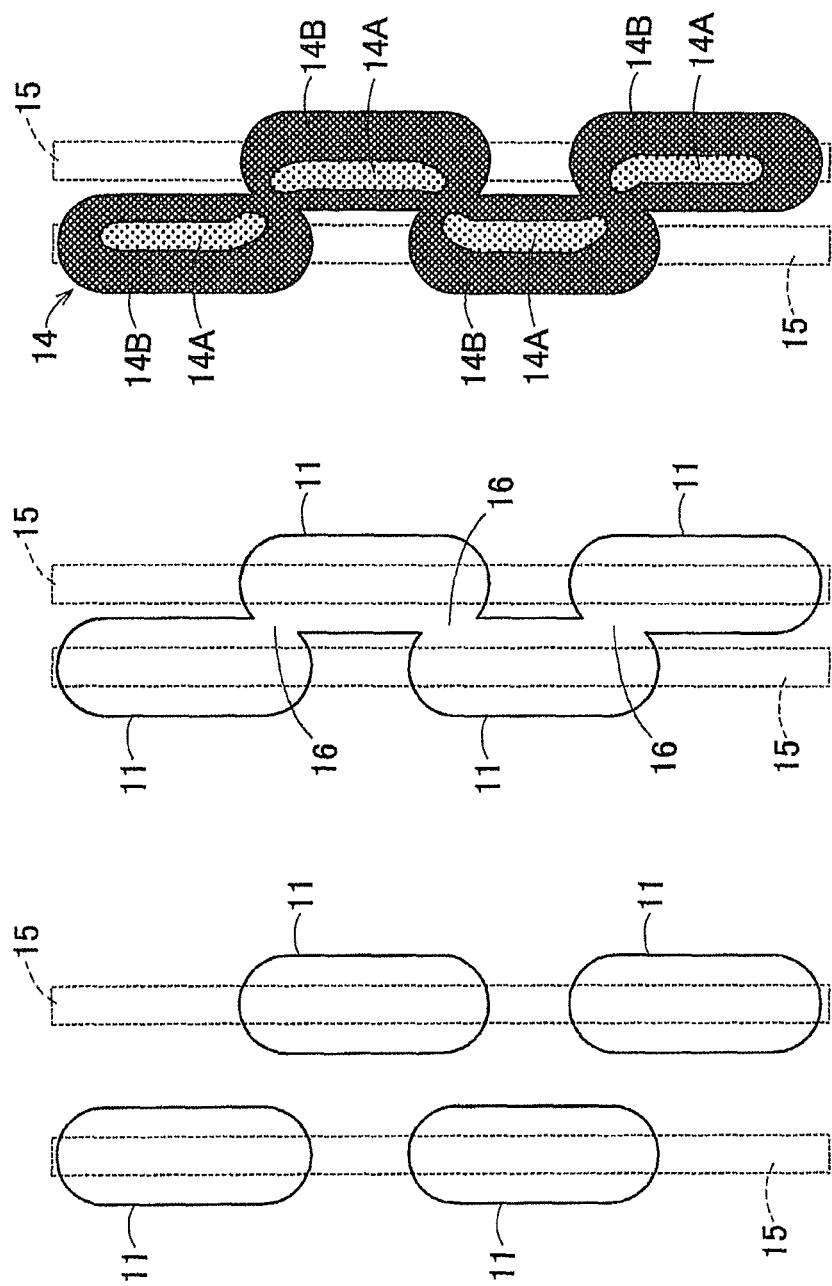

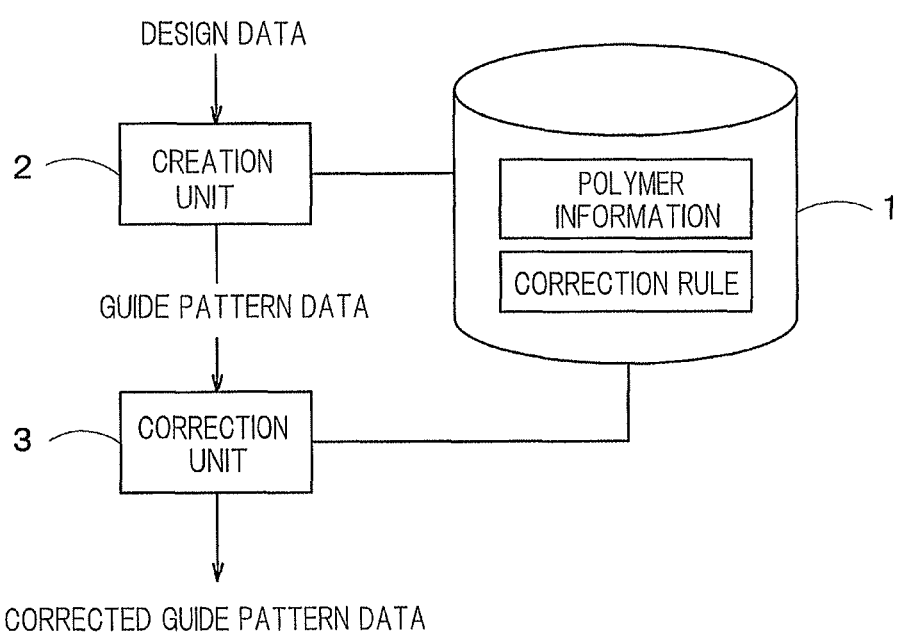
F I G. 3

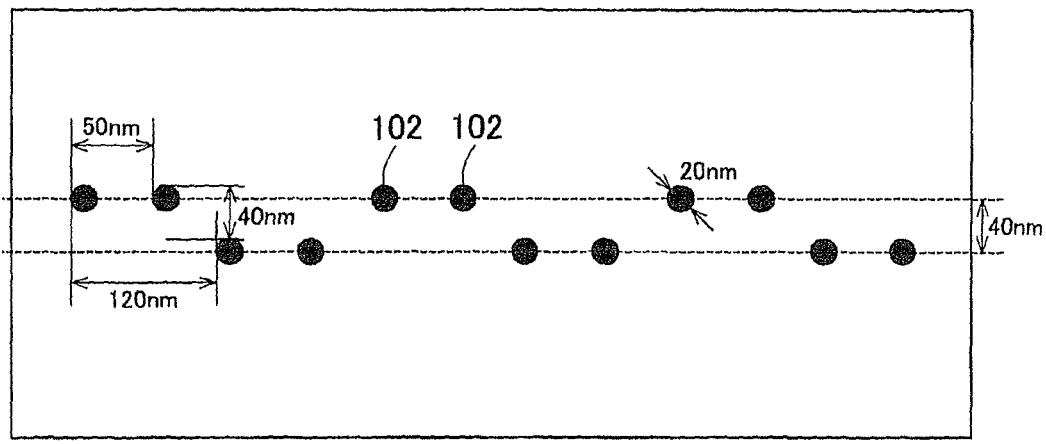
F I G. 5
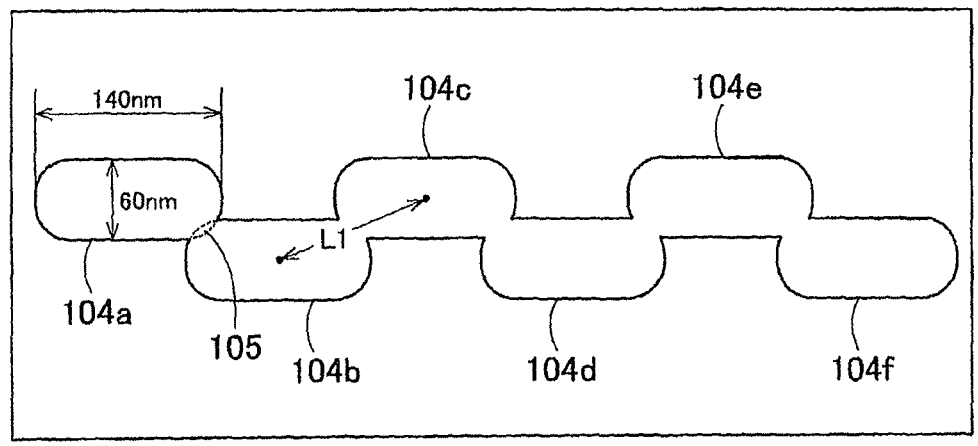
F I G. 6

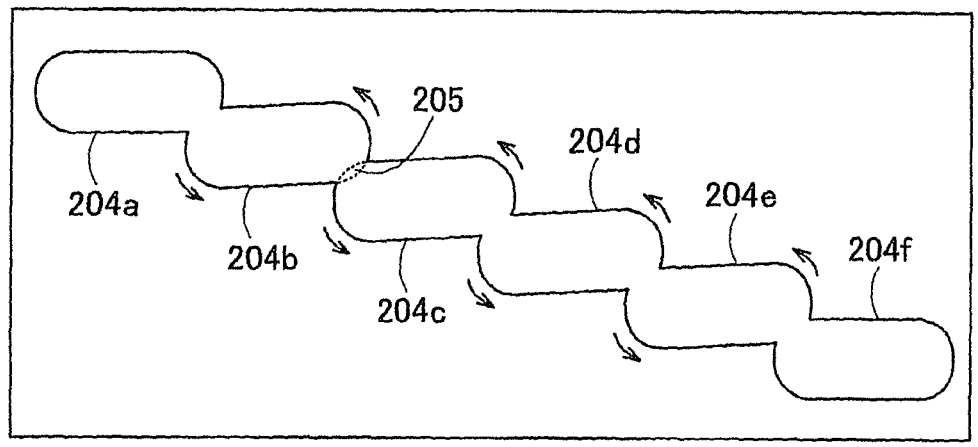
F I G. 11
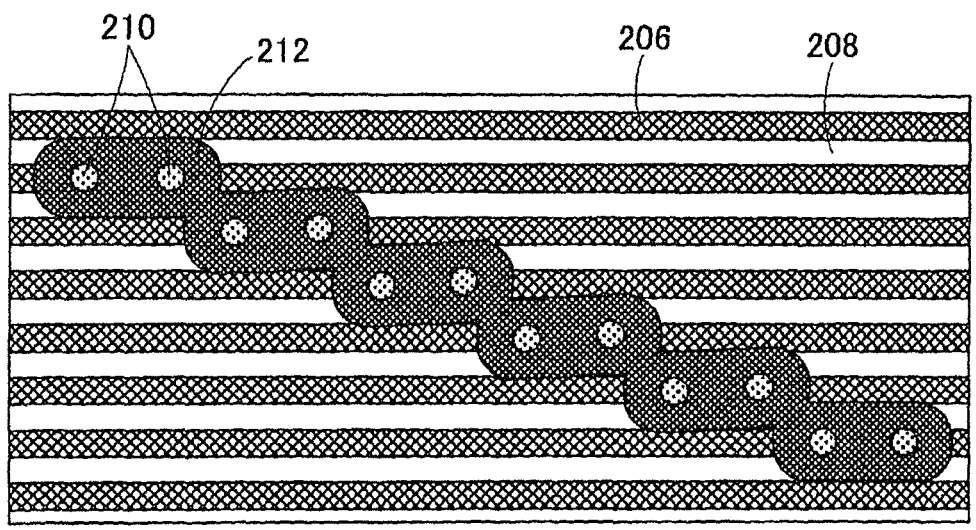
F I G. 12

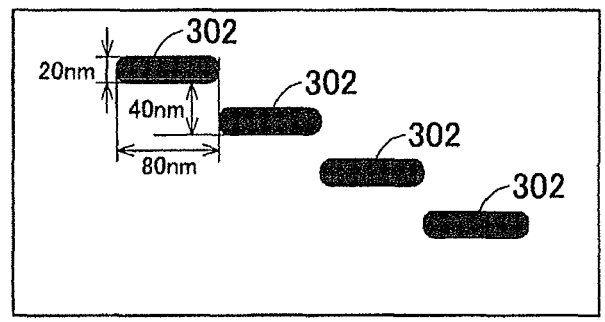
F I G. 13
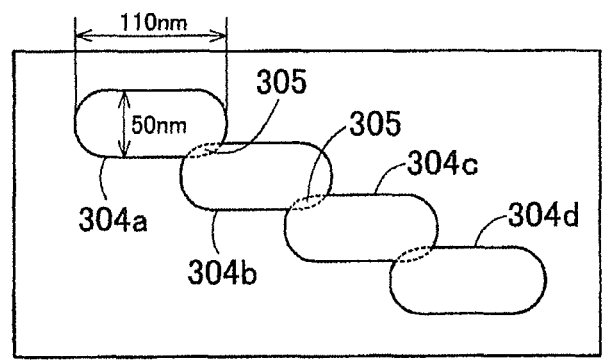
F I G. 14
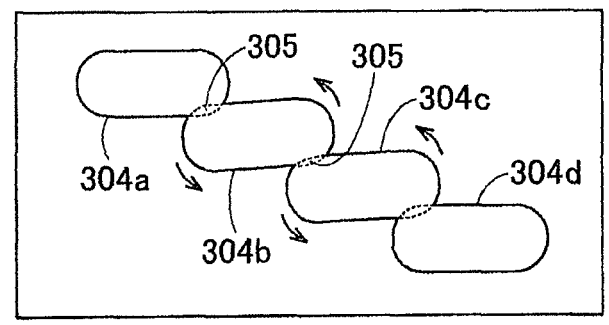
F I G. 15

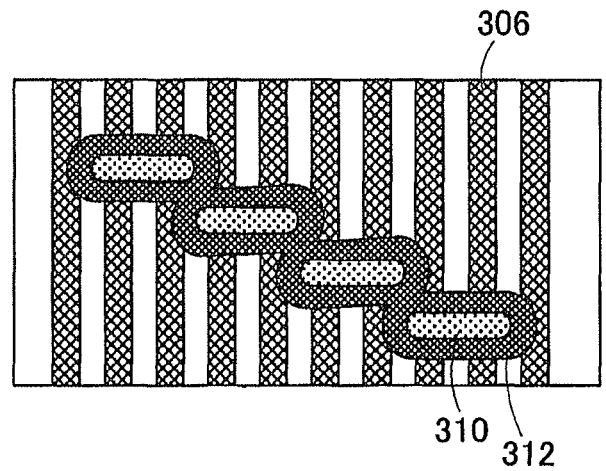
F I G. 16
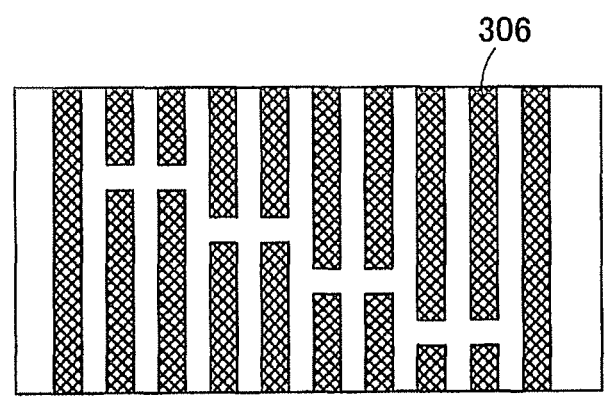
F I G. 17

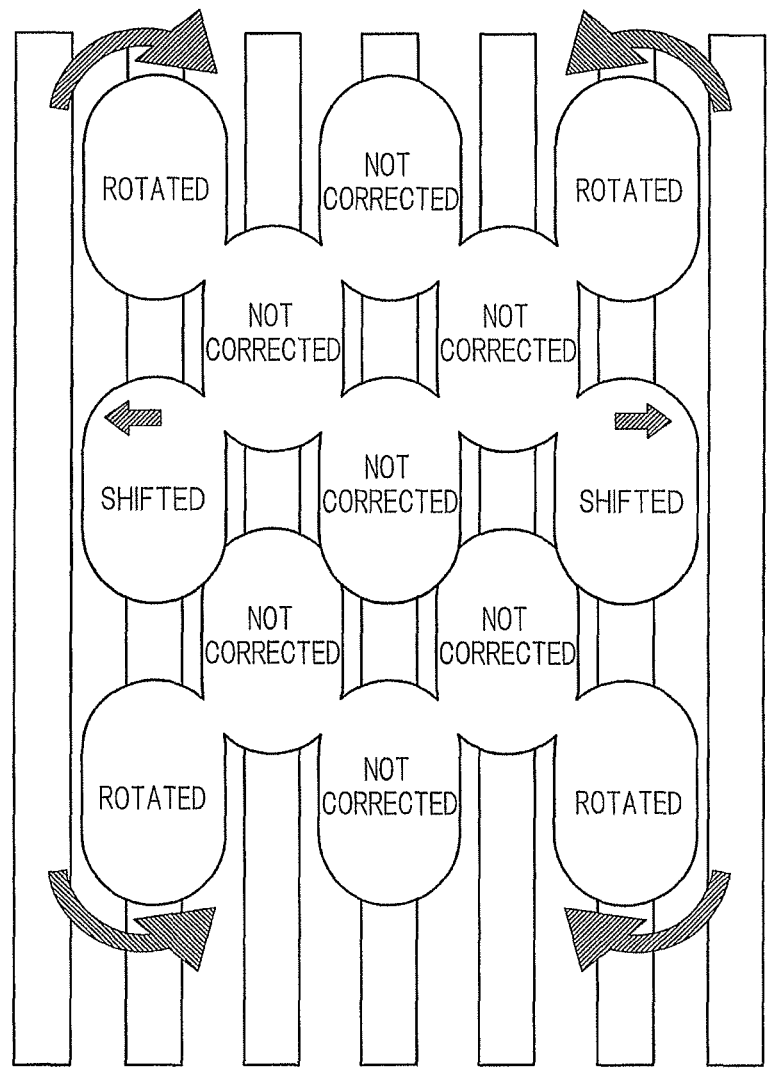
F I G. 18

GUIDE PATTERN DATA CORRECTING METHOD, PATTERN FORMING METHOD, AND COMPUTER READABLE RECORD MEDIUM

CROSS REFERENCE TO RELATED APPLICATION

This application is based upon and claims benefit of priority from the Japanese Patent Application No. 2013-29071, filed on Feb. 18, 2013, the entire contents of which are incorporated herein by reference.

FIELD

Embodiments described herein relate generally to a guide pattern data correcting method, a pattern forming method, and a computer readable record medium.

BACKGROUND

As candidates for a next-generation lithography technique in a semiconductor element manufacturing process, a double patterning technique by means of ArF-immersion exposure, EUV lithography, nanoimprinting, and the like are known. These lithography techniques have held a variety of problems such as a cost increase and through-put deterioration in association with increased fineness of a pattern.

Under these circumstances, self-assembly (DSA: Directed Self-Assembly) has been expected to be applied to the lithography technique. Since the self-assembly occurs due to a voluntary behavior of energy stabilization, a pattern with high dimensional accuracy can be formed. In particular, a technique of applying microphase separation of a high-polymer block copolymer enables formation of periodic structures in a variety of shapes of several to several hundred nm (nanometers) by simple coating and anneal processes. By transforming the high-polymer block copolymer into a spherical shape, a cylindrical shape, a lamellar shape or the like in accordance with a composition ratio of its block, and changing the size of the copolymer in accordance with its molecular weight, it is possible to form a dot pattern, a hole or a pillar pattern, a line pattern, or the like, having a variety of dimensions.

In order to form a desired pattern in a broad range by means of DSA, it is of necessity to provide a guide for controlling a generation position of a polymer phase formed by self-assembly. As the guide known are: a physical guide (graphoepitaxy) which has a concavo-convex structure with respect to the substrate surface and forms a microphase-separation pattern in its concave portion; and a chemical guide (chemical epitaxy) which is formed to be an underlayer of the DSA material and controls, based on a difference in its surface energy, a formation position of the microphase separation pattern.

Since the microphase separation pattern is formed with respect to a previously formed guide pattern, its alignment to a foundation pattern (underlying pattern) as an ultimate aligned object is indirect alignment, thereby causing low alignment accuracy.

BRIEF DESCRIPTION OF THE DRAWINGS

FIGS. 2A to 2C are views each illustrating an example of the self-assembly pattern;

FIG. 3 is a block diagram of a guide pattern data correcting device according to a first embodiment;

FIG. 5 is a view illustrating design data;

FIG. 6 is a view illustrating a guide pattern;

FIG. 11 is a view illustrating a collecting guide pattern according to a second embodiment;

FIG. 12 is a view illustrating a self-assembly pattern according to the second embodiment;

FIG. 13 is a view illustrating design data;

FIG. 14 is a view illustrating a guide pattern;

FIG. 15 is a view illustrating a correction guide pattern according to a third embodiment;

FIG. 16 is a view illustrating a self-assembly pattern according to the third embodiment;

FIG. 17 is a view illustrating processing of a foundation layer according to the third embodiment; and FIG. 18 is a view illustrating a correction guide pattern according to a modified example.

DETAILED DESCRIPTION

According to one embodiment, a guide pattern data correcting method is for correcting guide pattern data of a physical guide for formation of a polymer material to be microphase-separated. The physical guide has a plurality of concave portions in the guide pattern data, and at least two concave portions out of the plurality of concave portions are connected to each other. The guide pattern data is subjected to correction by shifting or rotation of at least either of the two connected concave portions.

Embodiments will now be explained with reference to the accompanying drawings.

Prior to description of embodiments of the present invention, how inventors made the present invention will be described.

Figure 1A:
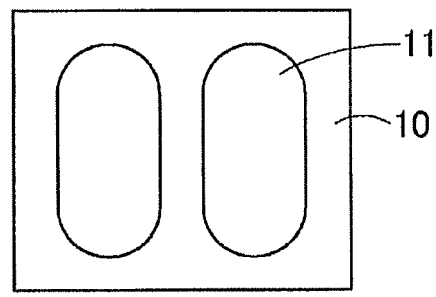
FIGS. 1A to 1D are views each illustrating an example of a self-assembly pattern.
Figure 1B:
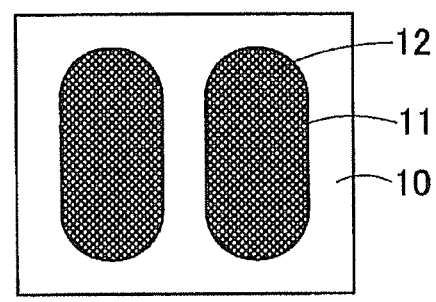

FIGS. 1A to 1D are top views each illustrating an example of a self-assembly pattern formed by microphase separation of a polymer layer. First, as illustrated in FIG. 1A, a physical guide 10 with a concavo-convex structure having a concave portion 11 in an elliptic shape (or a rounded rectangle shape) is formed. Next, as illustrated in FIG. 1B, a polymer layer 12 containing a polystyrene (PS) and polymethylmethacrylate (PMMA) block copolymer, for example, is formed inside this concave portion (slotted hole) 11.

Figure 1C:
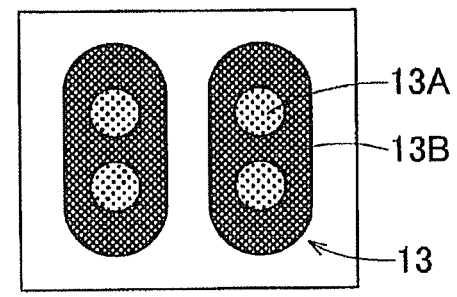
Figure 1D:
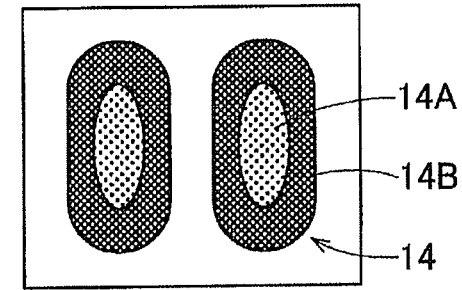

Then, annealing treatment is performed, to microphase-separating the polymer layer 12 and form a self-assembly pattern. The form of the self-assembly pattern varies in accordance with compositions and molecular weights of PS and PMMA contained in the polymer layer 12. For example, as illustrated in FIG. 1C, a self-assembly pattern 13 is obtained which is made up of a plurality of first polymer sections 13A each containing PMMA and having a cylindrical structure with a true circular-shaped top surface, and a second polymer section 13B containing PS and surrounding the first polymer section 13A. Alternatively, as illustrated in FIG. 1D, a self-assembly pattern 14 is obtained which is made up of a first polymer section 14A containing PMMA and having an elliptic cylindrical structure with an elliptic shaped top surface, and a second polymer section 14B containing PS and surrounding the first polymer section 14A.

FIG. 2A illustrates an example of forming the physical guide in alignment with an underlying line pattern 15. In FIG. 2A, the concave portions 11 of the physical guide are disposed in a staggered manner. When a pitch of the line pattern 15 is small, adjacent concave portions 11 are connected to each other as illustrated in FIG. 2B. In other words, two concave portions 11 share part of a region 16. When the self-assembly pattern 14 illustrated in FIG. 1D is formed using the physical guide as illustrated in FIG. 2B, the region 16 with the two concave portions 11 connected to each other has an influence on the shape of the end of the first polymer section 14A, as illustrated in FIG. 2C. This has lowered the accuracy in alignment of the first polymer section 14A with the line pattern 15. Moreover, even in the case of forming the self-assembly pattern 13 as illustrated in FIG. 1C, the connection between the two concave portions 11 has lowered the accuracy in alignment of the first polymer section 13A with the line pattern 15.

In the following embodiments, the problem as described above will be solved. Hereinafter, embodiments of the present invention will be described based on drawings.

Figure 4:
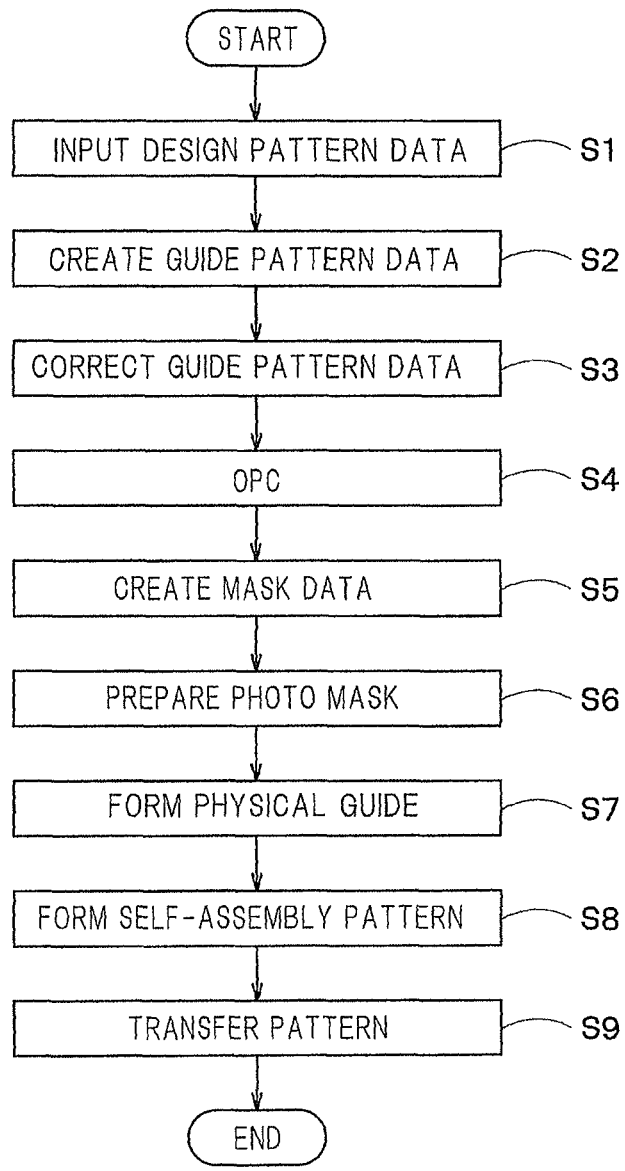
FIG. 4 is a flowchart explaining a pattern forming method of the first embodiment.

FIG. 3 is a block diagram of a guide pattern data correcting device, and FIG. 4 is a flowchart explaining a pattern forming method, to which a guide pattern data correcting method according to the present embodiment has been applied.

As illustrated in FIG. 3, the guide pattern data correcting device includes a storage unit 1 for storing polymer information and a correction rule, a creation unit 2 for creating guide pattern data based on design data and the polymer information, and a correction unit 3 for correcting the guide pattern data based on the correction rule, to create correction guide pattern data. The design data here is data of a pattern that is formed using self-assembly of a polymer material. Moreover, the guide pattern data is pattern data of the physical guide for controlling a generation position of the self-assembly pattern. Furthermore, the polymer information stored in the storage unit 1 includes correspondence of the polymer material to the shape, size, position and the like of the self-assembly pattern formed by self-assembly of the polymer material inside the physical guide. The correction rule is a rule which is referred to at the time of correcting the guide pattern data, and its detail will be described later.

For example, the creation unit 2 is input with design data where two true circles 102 each having a diameter of 20 nm and being arranged side by side with a pitch of 50 nm (nanometers, hereinafter abbreviated as nm) as illustrated in FIG. 5 are shifted 40 nm each in a staggered manner with a pitch of 120 nm and then disposed (Step S1 of FIG. 4).

Using the polymer information, the creation unit 2 obtains a pattern shape of a physical guide for forming a self-assembly pattern corresponding to the input design data, to create guide pattern data (Step S2). For example, using the information stored in the storage unit 1, the creation unit 2 obtains a physical guide pattern for forming two openings which are adjacent to each other with the minimum interval of 30 nm, to create guide pattern data as illustrated in FIG. 6 where openings 104a to 104f each having a minor axis of 60 nm and a major axis of 140 nm are disposed in a staggered manner. Here, each opening is connected to the opening adjacent thereto. In other words, the opening shares part of a region 105 with the adjacent opening. For example, one longitudinal (horizontal, in the figure) end of the opening 104c is connected with the opening 104b, and the other longitudinal end thereof is connected with the opening 104d.

Using the correction rule, the correction unit 3 corrects the guide pattern data created by the creation unit 2 (Step S3). As described above, when the two adjacent openings (concave portions) of the guide pattern are connected to each other, the shape of the self-assembly pattern obtained by microphase separation is distorted, to cause variations in pattern formation position, or the like (cf. FIG. 2C). The correction unit 3 corrects the guide pattern so as to suppress distortion that occurs in the shape of the self-assembly pattern and prevent lowering of the accuracy in alignment with the foundation pattern.

Figure 7:
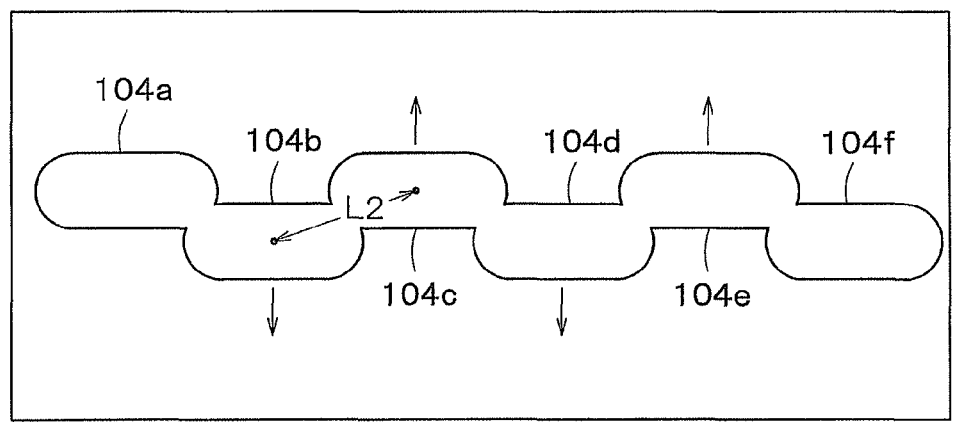
FIG. 7 is a view illustrating a correction guide pattern according to the first embodiment.

For example, as illustrated in FIG. 7, out of the plurality of openings 104a to 104f in the guide pattern, the openings 104b to 104e each having both ends thereof connected to the adjacent openings are shifted 2 nm in directions getting further from the respective adjacent openings along a minor-axial direction (vertical direction in the figure). Using such a guide pattern allows formation of the self-assembly pattern in alignment with a target position.

Shifting the opening reduces the size of the region 105 shared with the adjacent opening. In other words, correcting the guide pattern increases a distance between centroids of the two connected openings. For example, a distance L1 between the centroids of the opening 104b and the opening 104c in the guide pattern illustrated in FIG. 6 is longer than a distance L2 between the centroids of the opening 104b and the opening 104c in the correction guide pattern illustrated in FIG. 7.

In the correction rule, shift-correction processing as above is defined such that the region shared by the openings adjacent to each other becomes smaller, namely such that the distance between the centroids of the openings adjacent to each other becomes longer.

For example, a correction table as below is held as the correction rule with respect to an area A of the region 105 shared by the openings. A0, A1 and A2 satisfy $0 < A0 < A1 < A2$. Moreover, a1 and a2 satisfy $0 \leq a1 < a2$.

TABLE 1

| Area A of region shared by openings | Shift amount |
|---|---|
| $0 \leq A < A0$ | 0 |
| $A0 \leq A < A1$ | a1 |
| $A1 \leq A < A2$ | a2 |
| ... | ... |

When the area A of the region shared by the openings is smaller than A0, the shift-correction processing need not be performed. Further, when the area A is large, the shift amount is preferably made large. Referring to such a correction table allows execution of the correction processing.

It is to be noted that, although the correction table using the area A of the region 105 shared by the openings has been taken as an example here, another indicator such as a distance between contact points of the openings may be employed.

In the actual manufacturing flow, there is prepared a mask required in a lithography process for forming the correction guide pattern generated by the correction unit 3 as the physical guide pattern on the substrate. For that purpose, the correction guide pattern data is regarded as design data and OPC (Optical Proximity Correction) is performed, to create mask data (Steps S4, S5). Then, using the mask data, a photomask is prepared (Step S6).

Figure 8:
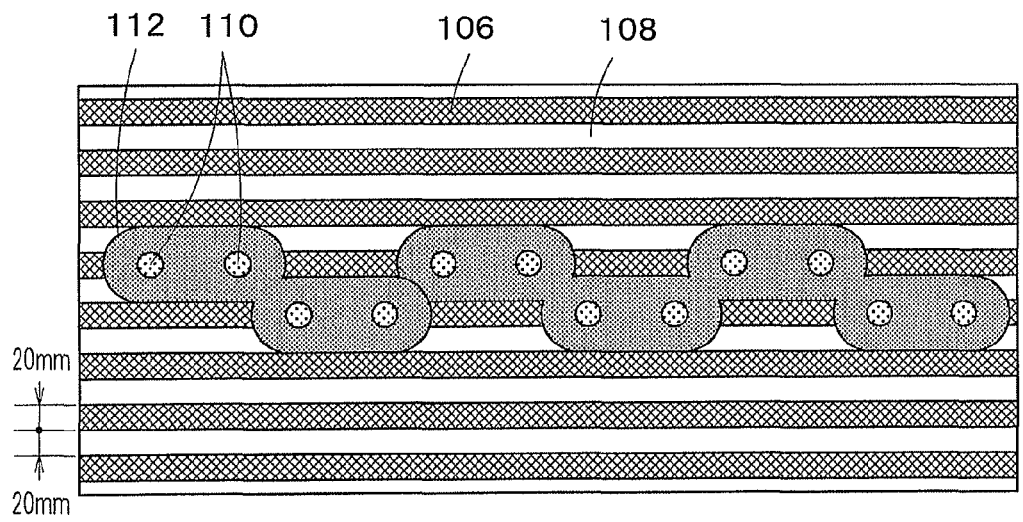
FIG. 8 is a view illustrating a self-assembly pattern according to the first embodiment.

Using the photomask as thus prepared, the physical guide is formed on a substrate (Step S7). For example, as illustrated in FIG. 8, a foundation layer is formed which has a line pattern alternately provided with linear tungsten 106 and linear insulating films 108 with a half-pitch of 20 nm on the silicon substrate.

Then, an interlayer insulating film with a film thickness of 200 nm is formed on the foundation layer by CVD (Chemical Vapor Deposition).

Next, SOC (Spin-On-Carbon, application-type carbon, hereinafter abbreviated as SOC) is applied onto this interlayer insulating film, and baking treatment is performed, to form an SOC film with a film thickness of 100 nm.

Subsequently, SOG (Spin-On-Glass, application-type glass, hereinafter abbreviated as SOG) is applied onto this SOC film, and baking treatment is performed, to form an SOG film with a film thickness of 45 nm.

Resist is applied onto this SOG film, and baking treatment is performed, to form a resist film with a film thickness of 100 nm, and form a resist pattern by lithography using the foregoing photomask.

The SOG film is etched with the resist pattern used as a mask, and the SOC film is then etched with the SOG film as a mask, to form a physical guide made up of the laminated SOC film and SOG film. The pattern shape of this physical guide corresponds to the correction guide pattern.

Thereafter, a polymer material is formed in the opening (concave portion) of the physical guide, and the polymer material is microphase-separated, to form a self-assembly pattern (Step S8). The polymer material is applied in such an amount that the film thickness of the polymer material layer inside the opening is comparable to the film thickness to the physical guide.

As the polymer material, for example, a block copolymer formed by binding between a first polymer block chain and a second polymer block chain is used. As the block copolymer, for example, a polystyrene (PS) and polymethylmethacrylate (PMMA) block copolymer can be employed. Compositions of PS and PMMA are adjusted, so as to obtain a cylinder structure at the time of phase separation. A solution of polyethylene glycol monoethyl ether acetate (PGMEA), which contains the PS and PMMA block copolymer with a concentration of 1.0 wt %, is spin-coated at a revolution speed of 1500 rpm.

Subsequently, the substrate is subjected to annealing treatment in a nitrogen atmosphere at 240° C. for one minute, to microphase-separate the block copolymer. Accordingly, as illustrated in FIG. 8, a self-assembly pattern is formed where two PMMA phases 110, each having a cylindrical structure whose top surface is a true circle with a diameter of 20 nm, are arranged side by side with a pitch of 50 nm inside each opening of the physical guide, and a PS phase 112 surrounds these PMMA phases 110. It is to be noted that in FIG. 8, illustrations of the physical guide and the interlayer insulating film are omitted.

As illustrated in FIG. 7, since the guide pattern has been corrected, a centroidal position of the PMMA phase 110 agrees with a central line of the tungsten line 106.

Thereafter, PMMA is selectively removed using a difference in etching rate between PS and PMMA, to form a hole pattern. Subsequently, with the remaining PS and the physical guide used as a mask, the hole pattern is transferred to the interlayer insulating film. Accordingly, the hole pattern having high accuracy in alignment with the underlying tungsten line 106 can be transferred to the interlayer insulating film (Step S9).

As thus described, according to the present embodiment, when the adjacent openings of the guide pattern are connected to each other, performing correction so as to make the distance between the centroids of the adjacent openings longer can improve the accuracy in alignment of the self-assembly pattern with the underlying pattern.

(Second Embodiment)

Figure 9:
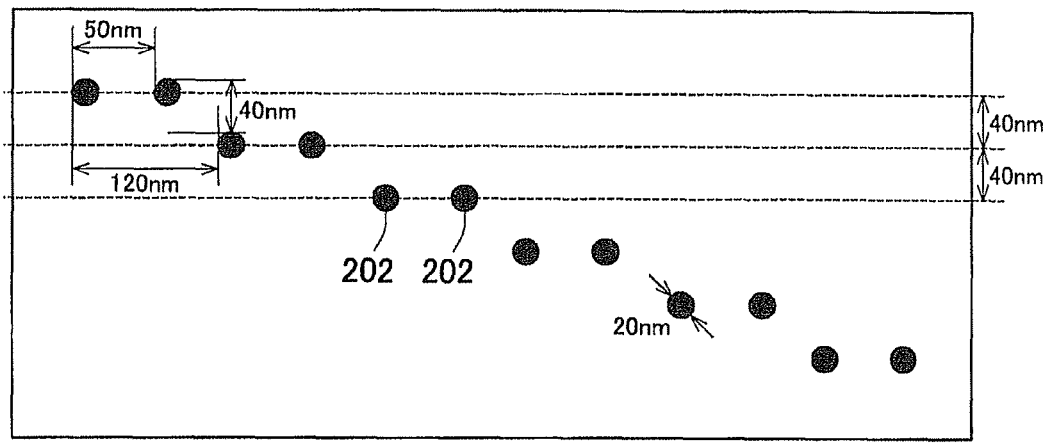
FIG. 9 is a view illustrating design data.

In the above first embodiment, the example as illustrated in FIG. 5 has been described in which the design data, where the two true circles 102 arranged side by side are disposed in a staggered manner, is input into the creation unit 2, but the design data may be one as in FIG. 9 where two true circles 202 each having a diameter of 20 nm and being arranged side by side with a pitch of 50 nm are disposed with an interval of 120 nm along a first direction (horizontal direction in the figure) and with an interval of 40 nm along a second direction (vertical direction in the figure) orthogonal to the first direction.

Figure 10:
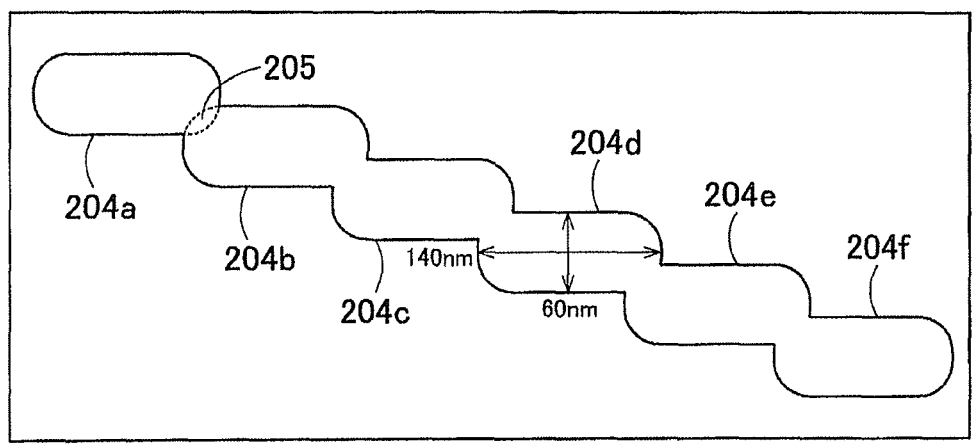
FIG. 10 is a view illustrating a guide pattern.

Using the polymer information, the creation unit 2 obtains a pattern shape of a physical guide for forming a self-assembly pattern corresponding to the input design data, to create guide pattern data. For example, using the information stored in the storage unit 1, the creation unit 2 obtains a physical guide pattern for forming two openings which are adjacent to each other with the minimum interval of 30 nm, to create guide pattern data as illustrated in FIG. 10 where openings 204a to 204f each having a minor axis of 60 nm and a major axis of 140 nm are disposed in a stepwise manner. In other words, centroids of the openings 204a to 204f are disposed on the same straight line.

Here, each opening is connected to the opening adjacent thereto. In other words, the opening shares part of a region 205 with the adjacent opening. For example, an upper portion of one longitudinal (horizontal, in the figure) end of the opening 204c is connected with the opening 204b, and a lower portion of the other longitudinal end thereof is connected with the opening 204d.

Using the correction rule, the correction unit 3 corrects the guide pattern data created by the creation unit 2. For example, as illustrated in FIG. 11, out of the plurality of openings 204a to 204f in the guide pattern, the openings 204b to 204e each having both ends thereof connected to the adjacent openings are rotated 3 degrees counterclockwise with the centroids of the respective openings at the centers.

Rotating the opening reduces the size of the region 205 shared with the adjacent opening.

In the correction rule, rotation-correction processing is defined in which the opening is rotated with its centroid at the center such that the region shared with its adjacent opening becomes smaller.

In the actual manufacturing flow, there is prepared a mask required in a lithography process for forming the correction guide pattern generated by the correction unit 3 as the physical guide pattern on the substrate. For that purpose, the correction guide pattern data is regarded as design data and OPC (Optical Proximity Correction) is performed, to create mask data. Then, using the mask data, a photomask is prepared.

Using the photomask as thus prepared, the physical guide is formed on a substrate. For example, as illustrated in FIG. 12, a foundation layer is formed which has a line pattern alternately provided with linear amorphous silicon 206 and linear silicon dioxide film 208 with a half-pitch of 20 nm on the silicon substrate.

Then, an interlayer insulating film with a film thickness of 200 nm is formed on the foundation layer by CVD (Chemical Vapor Deposition).

Next, SOC (Spin-On-Carbon) is applied onto this interlayer insulating film, and baking treatment is performed, to form an SOC film with a film thickness of 100 nm.

Subsequently, SOG (Spin-On-Glass) is applied onto this SOC film, and baking treatment is performed, to form an SOG film with a film thickness of 45 nm.

Resist is applied onto this SOG film, and baking treatment is performed, to form a resist film with a film thickness of 100 nm, and form a resist pattern by lithography using the foregoing photomask. This resist pattern is used as a physical guide. The pattern shape of the physical guide corresponds to the correction guide pattern.

Thereafter, a polymer material is formed in the opening (concave portion) of the physical guide, and the polymer material is microphase-separated, to form a self-assembly pattern. The polymer material is applied in such an amount that the film thickness of the polymer material layer inside the opening is comparable to the film thickness to the physical guide.

As the polymer material, for example, a block copolymer formed by binding between the first polymer block chain and the second polymer block chain is used. As the block copolymer, for example, a polystyrene (PS) and polymethylmethacrylate (PMMA) block copolymer can be employed. Compositions of PS and PMMA are adjusted, so as to obtain a cylinder structure at the time of phase separation. A solution of polyethylene glycol monoethyl ether acetate (PGMEA), which contains the PS and PMMA block copolymer with a concentration of 1.0 wt %, is spin-coated at a revolution speed of 1500 rpm.

Subsequently, the substrate is subjected to annealing treatment in a nitrogen atmosphere at 240° C. for one minute, to microphase-separate the block copolymer. Accordingly, as illustrated in FIG. 12, a self-assembly pattern is formed where two PMMA phases 210, each having a cylindrical structure whose top surface is a true circle with a diameter of 20 nm are placed side by side with a pitch of 50 nm inside each opening of the physical guide and a PS phase 212 surrounds this PMMA phase 210. It is to be noted that in FIG. 12, illustrations of the physical guide, the SOG film, the SOC film, and the interlayer insulating film are omitted.

As illustrated in FIG. 11, since the guide pattern has been corrected, a centroidal position of the PMMA phase 210 agrees with a central line of the amorphous silicon line 206.

Thereafter, PMMA is selectively removed using a difference in etching rate between PS and PMMA, to form a hole pattern. The SOG film is etched with the remaining PS and the physical guide (resist pattern) used as a mask, and the SOC film is then etched with the SOG film as a mask.

Subsequently, with the SOC film used as a mask, the hole pattern is transferred to the interlayer insulating film. Accordingly, the hole pattern having high accuracy in alignment with the underlying amorphous silicon line 206 can be transferred to the interlayer insulating film.

As thus described, according to the present embodiment, when the adjacent openings of the guide pattern are connected to each other, performing correction so as to rotate the opening with its centroid at the center can improve the accuracy in alignment of the self-assembly pattern with the underlying pattern.

(Third Embodiment)

In the above first and second embodiments, the examples have been described in which the design data where the two true circles arranged side by side with the minimum interval are disposed in a staggered manner or in a stepwise manner is input into the creation unit 2, but the design data may be one as in FIG. 13 where two ellipses 302 each having a major axis of 80 nm and a minor axis of 20 nm are disposed with an interval of 80 nm along a first direction (horizontal direction in the figure) and with an interval of 40 nm along a second direction (vertical direction in the figure) orthogonal to a first direction.

Using the polymer information, the creation unit 2 obtains a pattern shape of a physical guide for forming a self-assembly pattern corresponding to the input design data, to create guide pattern data. For example, using the information stored in the storage unit 1, the creation unit 2 obtains a physical guide pattern for forming an opening in an elliptic shape having a major axis of 80 nm and a minor axis of 20 nm, to create guide pattern data as illustrated in FIG. 14 where openings 304a to 304d each having a minor axis of 50 nm and a major axis of 110 nm are disposed in a stepwise manner. In other words, centroids of the openings 304a to 304d are disposed on the same straight line.

Here, each opening is connected to the opening adjacent thereto. In other words, the opening shares part of a region 305 with the adjacent opening. For example, an upper portion of one longitudinal (horizontal, in the figure) end of the opening 304b is connected with the opening 304a, and a lower portion of the other longitudinal end thereof is connected with the opening 304c.

Using the correction rule, the correction unit 3 corrects the guide pattern data, created by the creation unit 2. For example, as illustrated in FIG. 15, out of the plurality of openings 304a to 304d in the guide pattern, the openings 304b and 304c, each having both ends thereof connected to the adjacent openings, are rotated 4 degrees counterclockwise with the centroids of the respective openings at the centers.

Rotating the opening reduces the size of the region 305 shared with the adjacent opening.

In the correction rule, rotation-correction processing is defined in which the opening is rotated with its centroid at the center such that the region shared with its adjacent opening becomes smaller.

In the actual manufacturing flow, there is prepared a mask required in a lithography process for forming the correction guide pattern generated by the correction unit 3 as the physical guide pattern on the substrate. For that purpose, the correction guide pattern data is regarded as design data and OPC (Optical Proximity Correction) is performed, to create mask data. Then, using the mask data, a photomask is prepared.

Using the photomask as thus prepared, the physical guide is formed on a substrate. For example, as illustrated in FIG. 16, a foundation layer is formed which has an oxide film provided on the silicon substrate and a line pattern 306 made of a linear amorphous silicon film with a half-pitch of 20 nm and a height of 80 nm on the silicon substrate. A hollow is formed between the line of amorphous silicon.

Next, SOC (Spin-On-Carbon) is applied onto this foundation layer, and baking treatment is performed, to form an SOC film with a film thickness of 200 nm.

Subsequently, SOG (Spin-On-Glass) is applied onto this SOC film, and baking treatment is performed, to form an SOG film with a film thickness of 45 nm.

Resist is applied onto this SOG film, and baking treatment is performed, to form a resist film with a film thickness of 100 nm, and form a resist pattern by lithography using the foregoing photomask. This resist pattern is used as a physical guide. The pattern shape of the physical guide corresponds to the correction guide pattern.

Thereafter, a polymer material is formed in the opening (concave portion) of the physical guide, and the polymer material is microphase-separated, to form a self-assembly pattern. An amount of application of the polymer material is set such that the film thickness of the polymer material layer inside the opening is comparable to the film thickness of the physical guide.

As the polymer material, for example, a block copolymer formed by binding between the first polymer block chain and the second polymer block chain is used. As the block copolymer, for example, a polystyrene (PS) and polymethylmethacrylate (PMMA) block copolymer can be employed. Compositions of PS and PMMA are adjusted, so as to obtain an elliptic cylindrical structure at the time of phase separation. A solution of polyethylene glycol monoethyl ether acetate (PGMEA), which contains the PS and PMMA block copolymer with concentration of 1.0 wt %, is spin-coated at a revolution speed of 1500 rpm.

Subsequently, the substrate is subjected to annealing treatment in a nitrogen atmosphere at 240° C. for one minute, to microphase-separate the block copolymer. Accordingly, as illustrated in FIG. 16, a self-assembly pattern is formed inside each opening of the physical guide, the pattern having a PMMA phase 310 with an elliptic cylindrical structure whose top surface is an ellipse with a major axis of 80 nm and a minor axis of 20 nm, and a PS phase 312 which surrounds this PMMA phase 310. It should be noted that in FIG. 16, only the line pattern 306 and the self-assembly pattern are illustrated for convenience in description.

As illustrated in FIG. 15, since the guide pattern has been corrected, the long axial direction of the PMMA phase 310 is orthogonal to the line pattern 306.

Thereafter, PMMA is selectively removed using a difference in etching rate between PS and PMMA, to form a hole pattern. The SOG film is etched with the remaining PS and the physical guide (resist pattern) used as a mask, and the SOC film is then etched with the SOG film as a mask.

As illustrated in FIG. 17, at the time of etching the SOC film, the underlying line pattern 306 is simultaneously etched, to cut off the line pattern 306. Hence a butting shape of the underlying amorphous silicon lines (shape of the end surfaces of the lines being opposed to each other) can be formed in a narrow space with high positional accuracy. In FIG. 17, only the line pattern 306 is illustrated for convenience in description.

As thus described, according to the present embodiment, when the adjacent openings of the guide pattern are connected to each other, performing correction so as to rotate the opening with its centroid at the center can improve the accuracy in alignment of the self-assembly pattern with the underlying pattern.

Although the physical guide made up of the laminated SOC film and SOG film has been formed in the above first embodiment, the materials constituting the physical guide are not restricted to these.

Although the physical guide made up of the resist has been formed in the above second and third embodiments, the materials constituting the physical guide are not restricted to these.

In the above first to third embodiments, the block copolymer (DSA material) has been applied in such an amount that the block copolymer layer has a thickness comparable to the film thickness of the physical guide, but the amounts of application may be increased or decreased.

Although the block copolymer has been used as the DSA material in the above first to third embodiments, a polymer alloy may be used which has at least two or more kinds of segments such as a blend polymer that brings about similar phase separation to the block copolymer. Herein, the blend polymer means a polymer with segments not being connected.

Although the examples have been described in the above first and second embodiments where the cylindrical structure is formed by microphase separation, another shape such as the elliptic cylindrical structure as illustrated in FIG. 1D, a spherical structure, or a lamellar structure may be formed. Moreover, in the above third embodiment, the shape other than the elliptic cylindrical structure, such as a spherical structure or a lamellar structure, may be formed by microphase separation.

Although the correction unit 3 has corrected the guide pattern data by use of the correction rule stored in the storage unit 1 in the above first to third embodiments, the guide pattern data may be corrected by use of a correction value specified by the user.

Although the opening of the guide pattern has been shifted in the above first embodiment and the opening of the guide pattern has been rotated in each of the above second and third embodiments, these may be combined as illustrated in FIG. 18.

Although the design data and the pattern shape of the physical guide have periodic structures in the above first to third embodiments, they may have random structures.

At least part of the guide pattern data correcting device described in the above embodiments may be implemented in either hardware or software. When implemented in software, a program that realizes at least part of functions of the guide pattern data correcting device may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the guide pattern data correcting device may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A guide pattern data generating method for correcting guide pattern data of a physical guide for formation of a block copolymer material to be microphase-separated,
wherein:
the physical guide has a plurality of portions in the guide pattern data, the plurality of portions being disposed along a predetermined direction within a plane based on the pattern data of the plurality of portions, the pattern data of the plurality of portions being included in the guide pattern data, and at least two portions out of the plurality of portions are connected to each other, the method comprising:

subjecting the guide pattern data to correction in such a manner that the portions that have both ends respectively connected to other portions rotate about the portion's centroid within the plane wherein:

the plurality of portions have the same rotation angle; and the correction causes the size of a region shared by the at least two connected portions to reduce.

2. The guide pattern data generating method according to claim 1, wherein rotating the portions includes rotating the portions 4 degrees.

3. The guide pattern data correcting method according to claim 1, wherein centroids of the plurality of portions are disposed on a straight line.

\* \* \* \* \*